United States Patent [19]

Hii et al.

[11] Patent Number: 5,422,892
[45] Date of Patent: Jun. 6, 1995

[54] INTEGRATED CIRCUIT TEST ARRANGEMENT AND METHOD FOR MAXIMIZING THE USE OF TESTER COMPARATOR CIRCUITRY TO ECONOMICALLY TEST WIDE DATA I/O MEMORY DEVICES

[75] Inventors: Francis Hii; Inderjit Singh, both of Singapore, Malaysia; James E. Rousey, Dallas, Tex.

[73] Assignee: Texas Instruments Incorporated, Dallas, Tex.

[21] Appl. No.: 284,911

[22] Filed: Aug. 2, 1994

Related U.S. Application Data

[63] Continuation of Ser. No. 979,994, Nov. 23, 1992, abandoned.

[51] Int. Cl.6 .......................................... G01R 31/28
[52] U.S. Cl. .................................. 371/24; 371/21.2
[58] Field of Search ............. 371/24, 21.1, 21.2, 371/21.5, 21.3, 27

[56] References Cited

U.S. PATENT DOCUMENTS

| | | | |
|---|---|---|---|
| 3,544,777 | 12/1970 | Winkler | 371/21.2 |
| 3,866,171 | 2/1975 | Loshbough | 371/24 |
| 3,883,801 | 5/1975 | Hess | 371/24 |
| 4,744,061 | 5/1988 | Takemae et al. | 371/21.2 |
| 4,752,929 | 6/1988 | Kantz et al. | 371/24 |
| 4,841,525 | 6/1989 | Lieske et al. | 371/24 |
| 4,872,168 | 10/1989 | Aadsen et al. | 371/21.3 |

*Primary Examiner*—Hoa T. Nguyen
*Attorney, Agent, or Firm*—Rose Alyssa Keagy; Richard B. Havill; Richard L. Donaldson

[57] ABSTRACT

A device tester provides signals to a device under test. A parallel compare circuit then receives all the outputs of the device and compares each of the outputs with one another simultaneously. Next the parallel compare circuit will produce an output pattern which is compared to the expected test pattern stored in the tester. If the output pattern from the parallel compare circuit is the same as the expected test pattern the device will be considered a properly working device; conversely, if the patterns do not match the device will be considered an improperly working device.

6 Claims, 1 Drawing Sheet

INTEGRATED CIRCUIT TEST ARRANGEMENT AND METHOD FOR MAXIMIZING THE USE OF TESTER COMPARATOR CIRCUITRY TO ECONOMICALLY TEST WIDE DATA I/O MEMORY DEVICES

This application is a continuation of application Ser. No. 07/979,994, filed Nov. 23, 1992, now abandoned.

FIELD OF THE INVENTION

This invention relates generally to testing integrated circuit devices and more specifically to an apparatus and method of testing memory devices.

BACKGROUND OF THE INVENTION

A memory tester performs a test on memory devices by supplying a sequence of addresses and data patterns to the device under test (DUT), by reading the output from the DUT consisting of a series of test signals which create a test signal pattern and thereby determining if the DUT passed or failed the test. The output pin of the DUT is coupled to the receiver circuitry of the device tester which compares the test signal pattern on the output pin of the DUT with a reference test signal pattern stored within the tester to determine whether the DUT passed or failed the test.

Memory devices are available with various configurations and various numbers of outputs. For example, the one megabit dynamic random access memory (1M DRAM) device TMS4C1024 manufactured by Texas Instruments has a one megabit by one data I/O pin configuration, while the 1M DRAM TMS44C256 also manufactured by Texas Instruments has a 256 kilobit by four data I/O pins (256K×4) configuration. Even though the configuration and number of data I/O pins of these two devices is dissimilar, both of these devices are 1 MB DRAM devices.

For example, a memory tester may have four transceiver circuits and requires the connection of a separate transceiver circuit to each memory device data input/output pin to perform a device test. Therefore, one tester transceiver circuit is required to test a memory device having the 1M×1 configuration. A total of four memory devices in the 1M×1 configuration can be tested at once on this device tester which contains four transceiver circuits. Comparatively, testing a 1 MB DRAM in the 256K×4 configuration requires the use of four tester transceiver circuits per memory device, which therefore occupies the entire tester. In summary, because this device tester has only four receiver circuits, four 1M×1 configuration devices or only one 256K×4 configuration device can be tested at once. As a result, the number of devices a tester can test in parallel decreases with increasing number of data input/output pins on each device.

Using current tester design methodologies, many testers are incapable of economically testing wide I/O devices. The cost of redesigning a tester to add more receivers is cost prohibitive as receivers are complex and therefore very expensive. Tester manufacturers invest one to two years of design effort to double a particular tester's throughput capability through redesigning the memory algorithm generator.

There is a problem in finding a way to economically test wide data I/O memory devices.

SUMMARY OF THE INVENTION

These problems are solved by a method for testing semiconductor devices where the number of data I/O's coupled to device tester transceivers is reduced. In general, the invention includes a parallel compare circuit which takes all the outputs of a device and compares each of the outputs with one another simultaneously. If all of the outputs are of the same pattern state, the parallel compare circuit will produce an output pattern which is the same as the reference pattern generated by a tester. The result is that the device will pass the test and later be sold. If one or more of the outputs is incorrect, the parallel compare circuit will produce an output pattern that is not the same as the reference pattern generated by a tester. The result is that the device will fail the test and later be repaired or discarded.

Some of the advantages of the invention are 1) it converts a tester incapable of testing devices with numerous data I/O pins to a tester which can test such devices, 2) tester capability and useful life is increased at low cost, 3) design time for doubling tester capacity can be reduced by half, and 4) the number of devices which can be tested in parallel is increased.

BRIEF DESCRIPTION OF THE DRAWING

A better understanding of the invention will be gained by reading the following specification with reference to the drawing herein.

DETAILED DESCRIPTION OF THE PREFERRED EMBODIMENT

Figure 1:
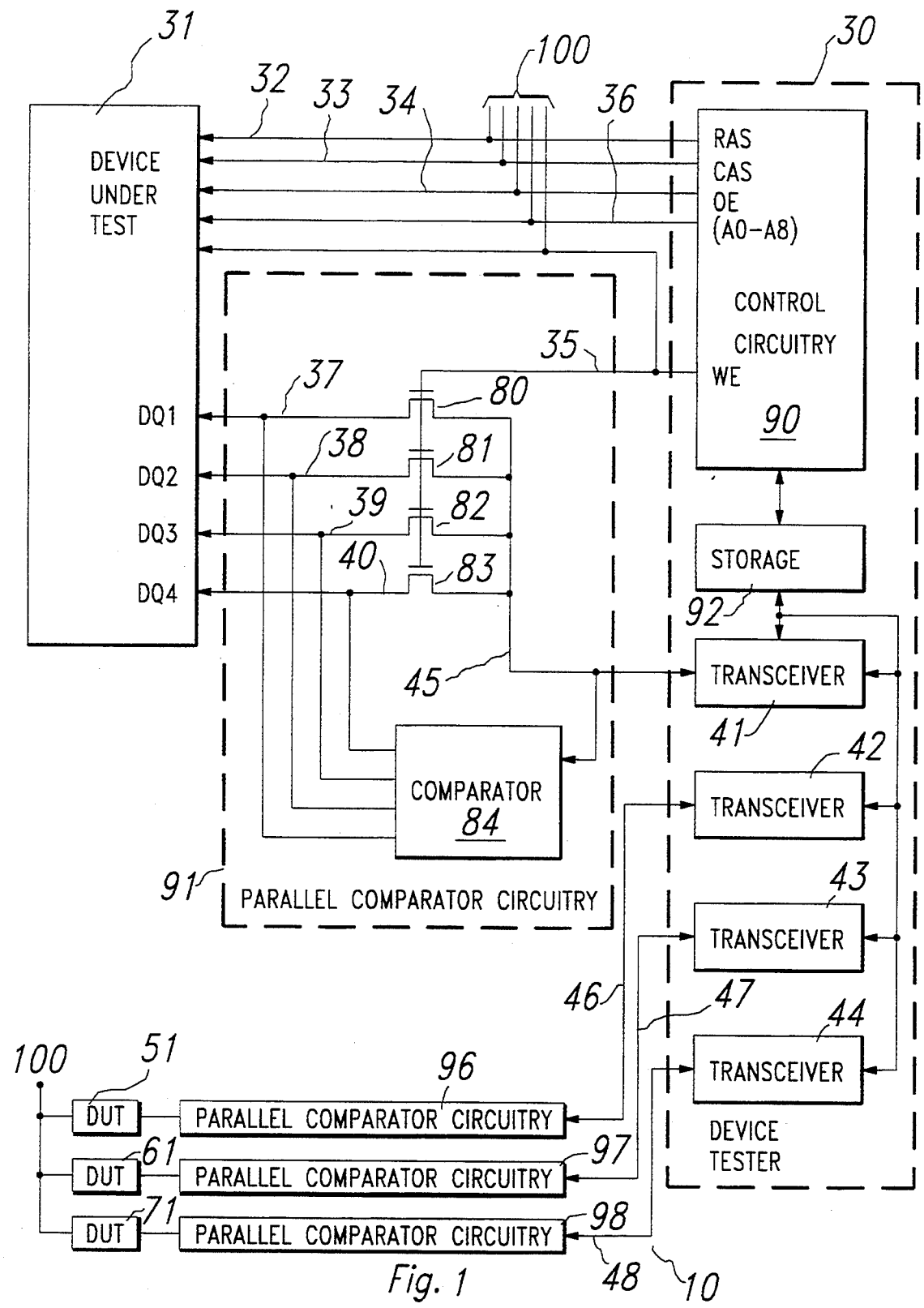
FIG. 1 is a block diagram illustrating a test system including a device tester coupled to a four data terminal device under test and a parallel compare circuit of the preferred embodiment.

FIG. 1 is a block level diagram illustrating a test system 10 having a typical device tester 30 coupled to a device under test (DUT) 31. The preferred embodiment of the invention operates within this system. The device tester 30 sends control signals as well as data to the DUT 31. In response, the DUT 31 sends output data signals to the device tester 30.

A typical device tester 30 used to test a 1 MB DRAM, such as the TMS44C256 manufactured by Texas Instruments Incorporated, uses control signals on leads 32–36 and input and output data signals on one lead 45 from one of four transceivers 41–44.

First of all, to write data the device tester 30 sends address signals to the device under test 31 via the address bus (ADR) which includes nine leads 36. A write enable (WE) signal on control lead 35 enables data to be written to the DUT 31. The row address strobe (RAS) signal on control lead 32 strobes in the row address on address bus leads 36 into the device under test. Address bus (ADR) includes nine leads 36. Thus, nine row address bits are set up on pins A0 through A8 and latched onto the DUT 31. The column address strobe signal (CAS) on the lead 33 strobes in the column address also on address leads 36. Thus, nine column address bits are set up on pins A0 through A8 and latched onto the DUT 31.

After the device tester 30 sends the address signal to the device under test 31 as described above, the device tester 30 sends a test data signal to parallel compare circuit 91. The test data signal that is sent to the device under test 31 is also stored by control circuitry 90 in the store register 92 of the device tester 30. In the next step the test data signal in the parallel compare circuitry is duplicated by enabling multiple paths through the parallel compare circuitry by enabling transistors 80–83. The duplicated test data signals are stored in the device under test 31 in plural storage locations selected by the respective row and column address signal on line 36.

The parallel compare circuit 91 includes one or more gating transistors 80–83 responsive to a write enable signal on the lead 35 from the control circuitry 90 for coupling the transceiver circuit 41 to the device under test 31 when data is sent to the device under test 31. Data in/data out lines 37–40 duplicates the test data signal from the tester during a write operation.

The output enable (OE) signal on control lead 34 activates the device output during a read operation. During a read operation the device output data signals are sent on lines 37–40 to the tester. The device under test 31 re-addresses the plural storage locations, and reads out the stored duplicated test data signals from the plural storage locations to the parallel compare circuitry 91 in response to a read signal on the control lead 34. The control signal disables the transistors 80–83 causing the stored duplicated test signals read out of device under test 31 to go to the comparator circuitry 84.

As shown in FIG. 1, the device tester 30 is coupled to the device under test (DUT) 31 through the parallel compare circuit 91. Therefore, in the preferred embodiment, the DUT output signals on the leads 37–40 go first to a parallel compare circuit 91. The multiple input single output comparator 84 is coupled to the device under test data leads for comparing the device under test data output signals on the leads 37–40 to each other and for producing the parallel compare circuit output signal on the lead 45.

Parallel compare circuit 91 takes all of the outputs 37–40 of a DUT 31 and compares the outputs 37–40 with each other. During a read cycle, a multiple input single output comparator 84 such as the SN74F521 available from Texas Instruments performs the comparison of the outputs on data input/data output lines 37–40 of DUT 31. If the outputs 37–40 are all of a similar voltage level which corresponds to the same logic level (logic 1 or logic 0) then the parallel compare circuit output signal is a first state. If the outputs 37–40 have different voltage levels which correspond to different logic levels, then the parallel compare circuit output signal is a second state.

Next, the comparator 84 compares the stored duplicated test data signals with one another and produces a single parallel compare circuitry output signal on line 45 having a first state if all of the stored duplicated test data signals are at a similar voltage level corresponding to the same logic level or a second state if at least one of the stored duplicated test data signals has a voltage corresponding to a different logic level as the others of the stored duplicated test data signals.

The transceiver circuit 41 next compares the parallel comparator circuit output signal on line 45 with the stored test data signal pattern in the storage register 92 to produce a test result signal which is a pass state if the parallel comparator circuit output signal pattern matches the stored test data signal pattern or which is a fail state if the parallel comparator circuit output signal pattern is different than the stored test data signal pattern.

Since only one transceiver circuit 41 is needed to perform the device test for this four data input/output device under test 31, the three remaining transceiver circuits 42–44 are available to concurrently test three additional multiple data input/output devices 51, 61, and 71 via leads 46, 47, and 48 and parallel comparator circuitry 96, 97, and 98.

Still other configurations could be comprehended by persons skilled in the art. For instance the invention could be implemented on a performance board, a load board or any other interface between the DUT 31 and the device tester 30. Additionally, the invention can be advantageously used to test other devices with multiple data inputs/outputs such as application specific integrated circuits.

While in accordance with the provisions and statutes there has been presented an illustrative embodiment of the invention, certain changes may be made without departing from the spirit of the invention as set forth in the appended claims. Various modifications of the disclosed embodiment will become apparent to persons skilled in the art upon reference to the description of the invention. It is therefore contemplated that the appended claims will cover any such modifications or embodiments as fall within the true scope of the invention.

What is claimed is:

1. A method for testing a semiconductor device comprising the steps of:
    a) sending an address signal from a device tester to a device under test having plural storage locations;
    b) storing a test data signal in a register located in said device tester;
    c) sending said test data signal from said device tester to parallel compare circuitry;
    d) duplicating said test data signal in said parallel compare circuitry and storing said duplicated test data signals in said device under test in plural storage locations selected by said address signal;
    e) re-addressing said plural storage locations having said duplicated test data signals stored therein and reading out said stored duplicated test data signals from said plural storage locations to said parallel compare circuitry in response to a read signal;
    f) comparing read out said stored duplicated test data signals with one another in said parallel compare circuitry and producing a parallel compare circuitry output signal having a first state if all of said stored duplicated test data signals are at a similar voltage level corresponding to a same logic level or a second state if at least one of said stored duplicated test data signals has a voltage which corresponds to a different logic level as the others of said stored duplicated test data signals; and
    g) sending said parallel compare circuitry output signal to said device tester.

2. The method of claim 1 wherein said duplicating step includes:
    duplicating said test data signal by enabling multiple paths through said parallel compare circuitry in response to a write signal; and
    storing said duplicated test data signals in said plural storage locations in said device under test in response to said write signal.

3. The method of claim 2 wherein said comparing step further includes:
    disabling said multiple paths through said parallel compare circuitry in response to said read signal.

4. The method of claim 1 further comprising the step of:

comparing said parallel comparator circuitry output signal with said stored register test data signal to produce a test result signal which is a pass state if said parallel comparator circuitry output signal matches said stored register test data signal or which is a fail state if said parallel comparator circuitry output signal is different than said stored register test data signal.

5. A test system comprising:

a socket for coupling to a particular device under test, said socket having plural data leads, said particular device under test having plural data leads and plural storage locations;

a device tester coupled to said socket, said device tester including:

a register, an address bus, control circuitry for sending address signals from said device tester over the address bus to said socket and for storing data signals created by said control circuitry in the register in said device tester, and transceiver circuitry coupled to said control circuitry for sending said created data signals via a parallel compare circuitry data lead from device tester to a parallel compare circuitry;

said test system further comprising:

said parallel compare circuitry coupled to said transceiver circuitry and to said plural data leads of said socket for sending said created data signals from said transceiver circuit to said plural storage locations in said device under test in response to address signals sent from the control circuit, said parallel compare circuitry reading out stored data signals from said plural storage locations in said device under test through said plural data leads of said socket and determining if one of said read out stored data signals on said socket plural data leads is different from other read out stored data signals on said socket plural data leads, then said parallel compare circuitry producing a parallel compare output signal on said parallel compare data lead; and said transceiver circuitry comparing said data signal from said register with said parallel compare output signal and producing a pass signal if said parallel compare output signal matches said register data signal, a fail signal if said register data signal is different than said parallel compare output signal.

6. The test system of claim 5 wherein said parallel compare circuitry comprises:

one or more gating transistors responsive to a control signal from said control circuitry for coupling said transceiving circuitry to said socket when data is sent to said socket, and for disabling a path between said socket and said transceiving circuitry when data is sent back from said socket to said transceiving circuitry; and a comparator coupled to said socket plural data leads for comparing said stored data signals on said socket plural data leads to each other, then said comparator producing said parallel compare output signal on said parallel compare data lead responsive to said comparison.

* * * * *